(12) United States Patent
Kung

(10) Patent No.: US 8,074,129 B2
(45) Date of Patent: Dec. 6, 2011

(54) MEMORY APPARATUS AND METHOD AND REDUCED PIN COUNT APPARATUS AND METHOD

(75) Inventor: Fan-Sheng Kung, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 732 days.

(21) Appl. No.: 11/808,480

(22) Filed: Jun. 11, 2007

(65) Prior Publication Data

US 2008/0307274 A1    Dec. 11, 2008

(51) Int. Cl.
G11C 29/00 (2006.01)
G01R 31/28 (2006.01)

(52) U.S. Cl. .......................... 714/718; 714/716; 714/723

(58) Field of Classification Search .................. 714/718, 714/733, 724; 365/200, 201
See application file for complete search history.

(56) References Cited

U.S. PATENT DOCUMENTS

| | | | |
|---|---|---|---|
| 5,386,583 A * | 1/1995 | Hendricks | 1/1 |
| 5,568,437 A * | 10/1996 | Jamal | 365/201 |
| 5,689,466 A * | 11/1997 | Qureshi | 365/201 |
| 6,256,757 B1 * | 7/2001 | Arkin | 714/718 |
| 6,701,469 B1 * | 3/2004 | Matter et al. | 714/703 |
| 6,768,694 B2 * | 7/2004 | Anand et al. | 365/225.7 |
| 6,862,703 B2 * | 3/2005 | Oonk | 714/718 |
| 6,892,345 B1 * | 5/2005 | Ghameshlu et al. | 714/798 |
| 7,013,414 B2 * | 3/2006 | Takeshige et al. | 714/719 |
| 7,406,572 B1 * | 7/2008 | Nguyen | 711/154 |
| 2003/0038650 A1 * | 2/2003 | Combs et al. | 324/765 |

* cited by examiner

*Primary Examiner* — Jeffrey A Gaffin
*Assistant Examiner* — Daniel McMahon
(74) *Attorney, Agent, or Firm* — Muncy, Geissler, Olds & Lowe, PLLC

(57) ABSTRACT

A memory apparatus is disclosed, comprising a memory device under test, a reduced-pin-count device and a built-in self test device. The reduced-pin-count device is used to find a faulty cell address in the memory device under test during a pre-fuse stage. The built-in self test device is used to detect whether the memory device under test has any error during a post-fuse stage. The memory apparatus is capable of promptly finding the address of a defect cell in the memory device under test such that repairs can be performed during a fuse stage. Furthermore, the invention reduces the pin count required during testing the memory device under test. Thus, the cost of testing equipment is reduced and the performance of memory testing is enhanced.

9 Claims, 6 Drawing Sheets

MEMORY APPARATUS AND METHOD AND REDUCED PIN COUNT APPARATUS AND METHOD

BACKGROUND OF THE INVENTION

1. Field of the Invention

The invention relates to a memory apparatus and a test method, and in particular relates to an apparatus and a test method for a memory chip with reduced pin count circuit.

2. Description of the Related Art

With increased scope of memory chip and the complication of design thereof, test speed and accuracy of chips has become critical in determining efficiency of memory chip production. For example, design for testability (DFT) has been developed, in which enhanced circuit design during chip design stage efficiently reduces the time for chip tests, to improve failure coverage rate and product quality and production speed, as well as reducing the time for chip tests by a built-in self test (BIST).

A memory chip comprises a plurality of memory cells, some of which may be defective. Preparing faulty cells with redundant memory cells can address the problem. Defective memory cells are replaced with redundant memory cells by laser fuses. This stage is called as a fuse stage. The process to find the defective memory cells in a memory before the fuse stage is called a pre-fuse stage. After the fuse stage, the memory chip needs to be verified again. This process is called as a post-fuse stage.

Some memory chip test techniques check each memory cell in a memory chip during the pre-fuse stage, and then perform the fuse operation. Then an I/O compressor or a BIST determines whether the memory chip is recovered during the post-fuse stage. This techniques requires more time to find the defective memory cells in a chip during the pre-fuse stage, and testing apparatus requires more pin count to input the test data into the memory chip. Other memory chip test techniques find the defective memory cells in a memory chip during the pre-fuse stage and verify whether a defective memory cell exists during the post-fuse stage both by a BIST. This technique is less time-consuming and reduces pin count required but increases the manufacture cost of a chip by the high efficient (fast and correct verification) BIST which occupies more chip area and requires more complicated circuit design.

BRIEF SUMMARY OF INVENTION

A detailed description is given in the following embodiments with reference to the accompanying drawings.

A memory apparatus comprises a memory device under test, a reduced-pin-count (RPC) device and a built-in self test device. The RPC device is used to find an faulty cell address in the memory device under test during a pre-fuse stage. The RPC device comprises a demultiplexer and a verifier. The demultiplexer controls a plurality of input terminals of the memory device under test in which the input terminals are used to input test data. The verifier is coupled to the plurality of input terminals of the memory device under test for verifying a output from the memory device under test. The built-in self test (BIST) device used to detect whether the memory device under test has any error during a post-fuse stage.

A reduced-pin-count device is disclosed, comprising an output verifier and a counter. The output verifier receives a plurality of outputs of a memory device under test and determines whether the outputs are identical, sending a pass signal if so and a failure signal if at least one of the outputs is different. The counter is used to output an error indication signal to indicate an output address of an erroneous data in the memory device under test if the output verifier sends the failure signal.

A test method for reduced-pin-count is disclosed. First, it is determined whether outputs of a memory device under test are identical. A pass signal is sent if the outputs are identical and a failure signal is sent if at least one of the outputs is different. As the failure signal is received, an error indication signal is sent to indicate an address of an output with erroneous data in the memory device under test.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

A memory apparatus of the invention comprising a memory device under test quickly and accurately locates a defect cell (if a defect cell exists) in the memory device under test. Memory devices under test comprise a plurality of memory cells in an array as a memory array.

The memory apparatus in the embodiment of the invention comprises a memory device under test, a reduced-pin-count (RPC) device and a built-in self test (BIST) device. The RPC device provides faulty cell address in the memory device under test during the pre-fuse stage. Then a redundant memory cell reserved in the memory device replaces the defective memory cell corresponding to the faulty cell address during the fuse stage. During the post-fuse stage, a BIST is used to verify whether an faulty cell address exists in the memory device.

Figure 1:
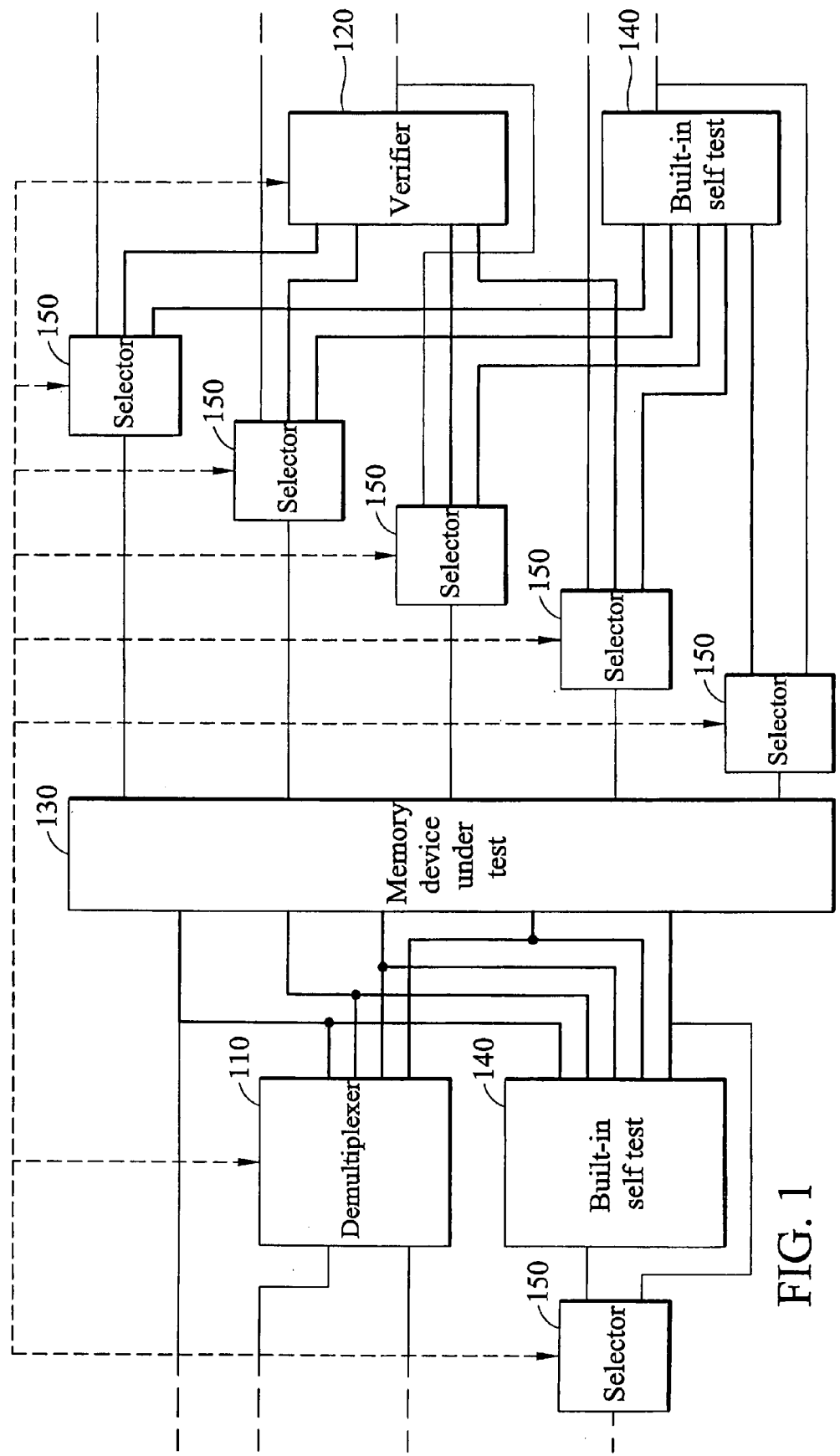
FIG. 1 is a diagram illustrating a memory apparatus of the invention.

FIG. 1 is a diagram illustrating a memory apparatus of the invention. The memory apparatus may be a commodity memory chip, comprising a memory device under test 130, a demultiplexer 110, a verifier 120, a built-in self test device 140 and a plurality of selectors 150. The memory device under test may be a DRAM array, a SRAM array or a flash memory array, and it should not be taken in a limiting sense. Demultiplexer 110 and verifier 120 regard as a RPC device together or respectively because Demultiplexer 110 reduces pin count of input and verifier 120 reduces pin count of output. Selectors 150 are used to determine the outputs of memory device under test 130 are via its pin respectively or the outputs are sent to verifier 120 or built-in self test device 140 to verify. Selectors 150, for example, comprise at least one transistor. Demultiplexer 110 is used to control a plurality of input terminals of memory device under test 130 in which the input terminals are for test data input. Verifier 120 is coupled to the input terminals of memory device under test 130 for verifying the outputs of memory device under test 130.

During the pre-fuse stage, the RPC device is selected to find the faulty cell address fast and accurately. In addition, the RPC device reduces pin count to decrease the cost of test facilities. One touch down of a probe card which has the same number of pin count may detect more memory devices which are disclosed in the embodiment. Thus, the average time for testing memory chips is decreased. During the post-fuse stage, the RPC device or built-in self test device 140 are selected to verify whether an error occurs in the memory device. People who are experienced in this field should know that the RPC device and BIST device are not necessarily exclusive of each other. It is possible that the function of both devices to be implemented by one device. The PRC device is used with memory tester in the pre-fuse stage while the BIST device is used in the post-fuse and burn-in stages with little tester involvement.

Figure 2:
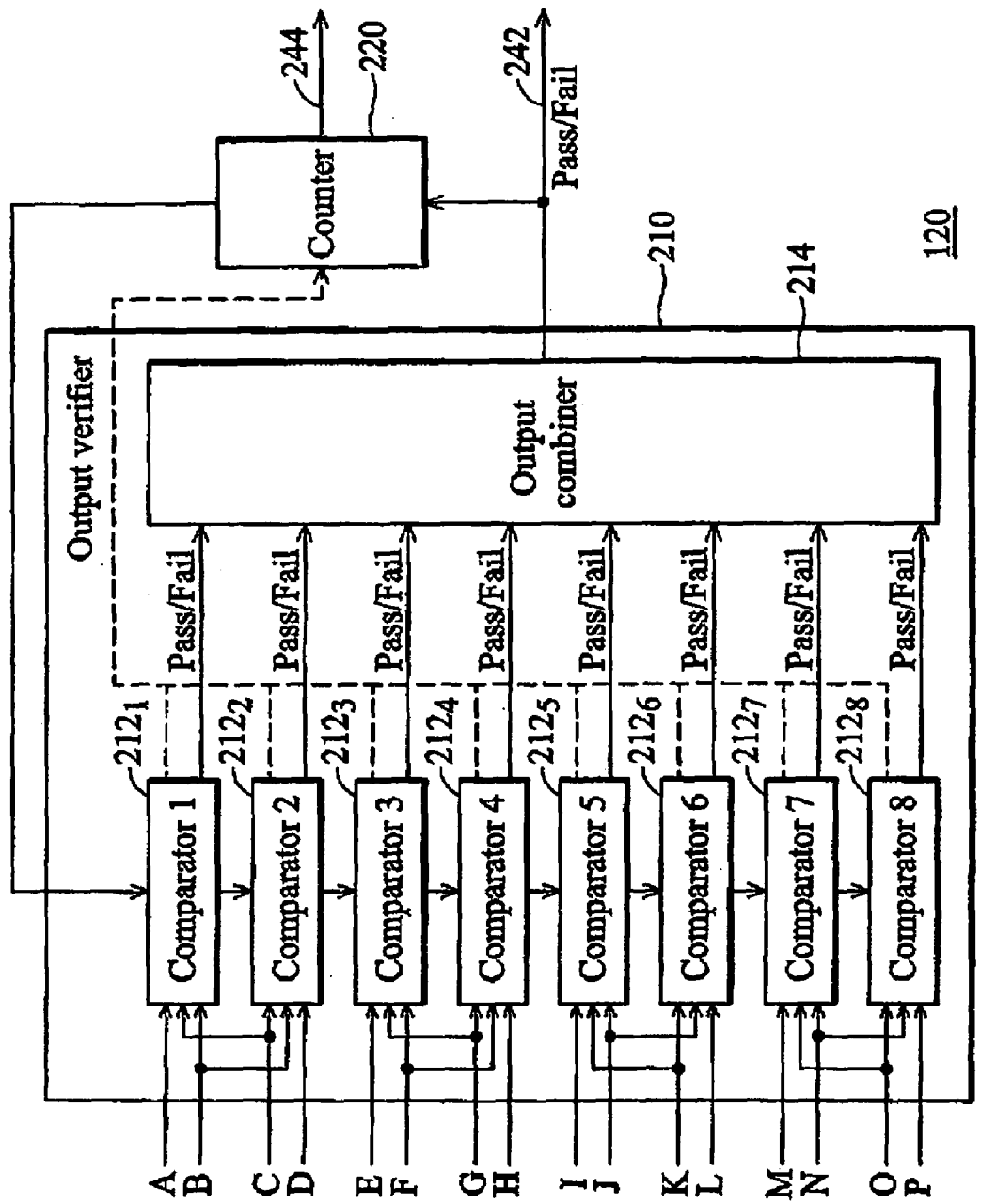
FIG. 2 is a diagram illustrating a reduced-pin-count device of the invention.

FIG. 2 shows an embodiment of verifier 120 in FIG. 1. Verifier 120 is one of the reduced-pin-count devices. In FIG. 2, verifier 120 decreases outputs from 16 outputs (A-P) to 2 outputs, thus pin count is reduced. Verifier 120 comprises an output verifier 210 and a counter 220. Output verifier 210 receives a plurality of outputs of memory device under test 130 and compares whether the outputs are identical. If the outputs are identical, a pass signal is sent via pin 242; on the contrary, if at least one output is different, a failure signal is sent via pin 242. The failure signal on pin 242 enables counter 220 at the same time. Thus, as output verifier 210 sends a failure signal, counter 220 outputs an error indication signal to indicate the output address of the erroneous data in the memory device under test (i.e. which one of the outputs A-P is the defective memory cell in the memory device under test). In the embodiment, the timing chart of the error indication signal, for example, is a failed cell position timing chart.

The output verifier 210 comprises a plurality of comparators $212_{1-8}$ and an output combiner 214. The comparators, for example, are comprising logic gates, each comparator $212_n$ (n is an integer between 1 and 8) receives portions of the plurality of outputs of memory device under test 130 to determine whether the portions of the outputs are identical. A temporary pass signal is sent if the portions of the outputs are identical and a temporary failure signal is sent if at least one output is different. In a preferred embodiment, memory device under test 130 has 16 outputs (output ports A-P) and uses 8 comparators $212_{1-8}$ to receive the outputs. Each comparator 212 is configured with 3 inputs to receive the outputs, and comparators $212_{1-8}$ (from the top to the bottom) receive the output ports of memory device under test 130 in sequence of ABC, BCD, EFG, FGH, UJK, JKL, MNO and MOP. Each comparator $212_n$ determines to output the temporary pass signal or the temporary failure signal according to whether all of the inputs are identical. In some embodiments, it is also possible to compare the input data from the output ports of memory device under test 130 using fewer comparators, and it should not be taken in a limiting sense.

As comparators $212_{1-8}$ finish the comparison between the input data from the output ports of memory device under test 130, each comparator $212_n$ outputs a temporary signal (temporary pass/temporary failure) and the temporary signals are sent to an output combiner 214. Output combiner 214 (which may comprise a plurality of logic gates) combines the temporary signals from comparators $212_{1-8}$ to determine whether all the comparators $212_{1-8}$ output a temporary pass signal. If all comparators $212_{1-8}$ output a temporary pass signal, all the outputs from output ports A-P are identical. Thus, output combiner 214 outputs a pass signal via pin 242. If one of the outputs of comparators $212_8$ is a temporary failure signal, at least one output from output ports A-P is different from other outputs (failure). Thus, output combiner 214 outputs a failure signal via pin 242 and enables counter 220 at the same time to trigger all comparators $212_{1-8}$. All comparators $212_{1-8}$ will start identifying and to notify counter 220 which output port has erroneous data. Counter 220 outputs an error indication signal to indicate the address of the erroneous data in the memory device under test.

Figure 3:
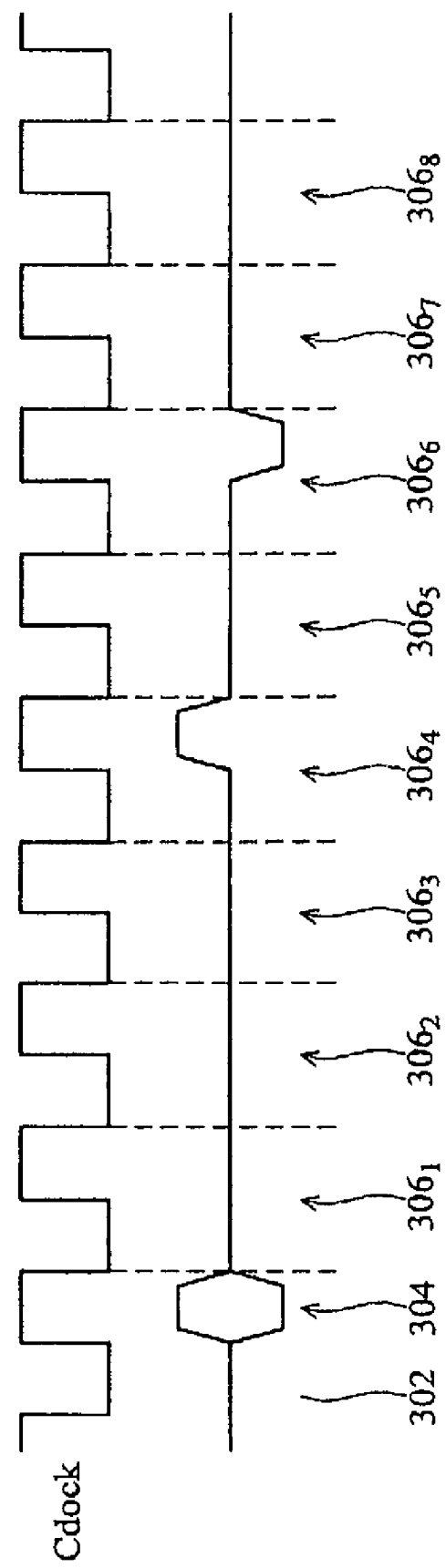
FIG. 3 is a timing chart of a failed cell position output from a counter of a reduced-pin-count device.

FIG. 3 shows a possible timing chart of an error indication signal from counter 220 in FIG. 2. The upper part in FIG. 3 is a referencing work clock Clock, and the lower part is an error indication signal 302. After the start section 304, error indication signal 302 may be sectioned into a plurality of sections $306_{1-8}$. Each section $306_n$ corresponds to a comparator $212_n$, and variation of the waveform may be used to determine the accuracy of the inputs of comparator $212_n$. First, waveforms $306_{1-3}$ corresponding to the first three comparators $212_{1-3}$ are all horizontal, indicating that the input data of comparators $212_{1-3}$ are correct. Waveform $306_4$ corresponding to comparators $212_4$ is powered up, indicating that the data from output port G is correct and that from output port H is incorrect. Finally, waveform $306_6$ corresponding to comparator $212_6$ is powered down, indicating that the data from output port K is incorrect and that from output port L is correct. Briefly, among the output ports (output ports A~P) of the memory device under test, the incorrect data from output port H and K and the correct data from other output ports are found according to the error indication signal timing chart. Persons in the art may define the corresponding meaning of the waveforms, it should not be taken in a limiting sense.

Figure 4:
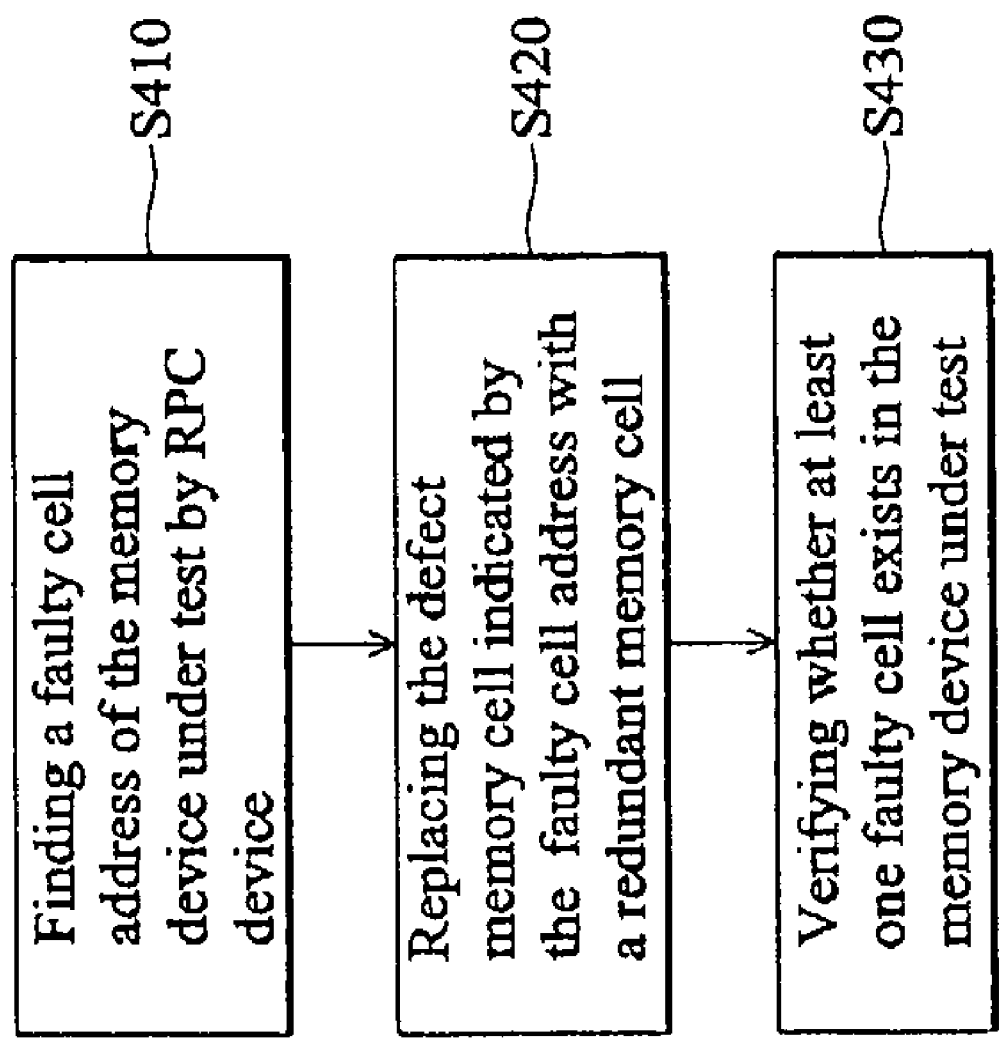
FIG. 4 is a flowchart illustrating a test method for a memory of an embodiment in the invention.

FIG. 4 is a flowchart illustrating a test method for a memory of an embodiment in the invention. First, an faulty cell address of a memory device under test is found by a RPC device (S410). The faulty cell address is an address of a defective memory cell in the memory device under test. The address of the defective memory cell in the memory device under test must be found before the fuse stage, and then a repair operation is performed. Next, a defective memory cell indicated by the faulty cell address is replaced with a redundant memory cell (S420). Last, the memory device under test is verified whether at least one error exists (S430). The verification may be achieved by a RPC device or a built-in self test device, selected by users.

In the memory device in FIG. 1, for example, a RPC device comprising demultiplexer 110 and verifier 120 is used to input data and compare the outputs to find the address of a defective memory cell during the pre-fuse stage. The defective memory cell is replaced by a redundant memory cell during the fuse stage. Memory device under test 130 is verified whether a defective memory cell exists by the combination of demultiplexer 110 and verifier 120 or built-in self test device 140 during the post-fuse stage.

Figure 5:
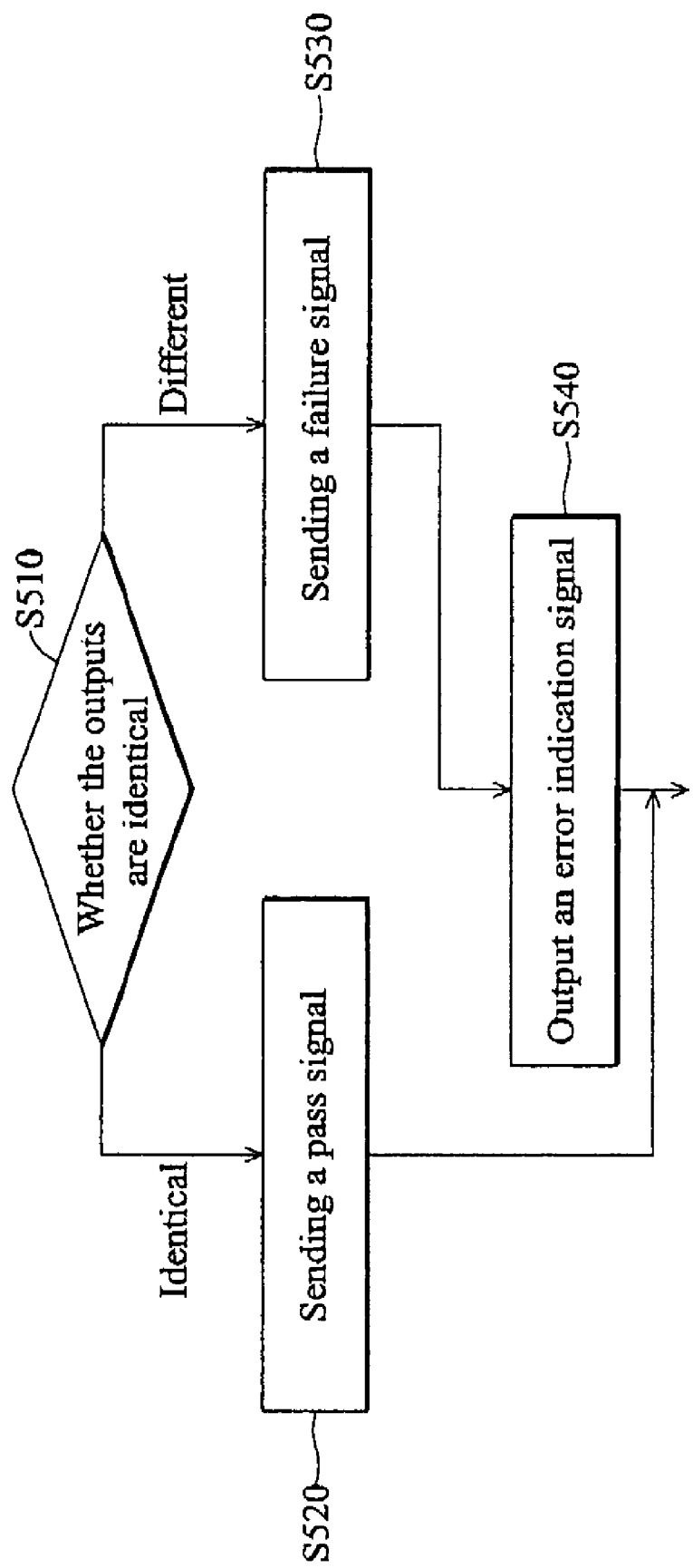
FIG. 5 is a flowchart of a test method for reduced-pin-count in an embodiment of the invention.

FIG. 5 is a flowchart of a test method for reduced-pin-count in an embodiment of the invention. Both FIG. 2 and FIG. 1 are referenced. Output verifier 120 verifies whether the outputs of memory device under test 130 are identical (S510). A pass signal is sent if the outputs are identical (S520), and a failure signal is sent if at least one output is different (S530). Next, output verifier 210 enables counter 220 to output an error indication signal via pin 244 if output verifier 210 sends a failure signal (S540), in which the error indication signal indicates the output address of an erroneous data in memory device under test 130.

Figure 6:
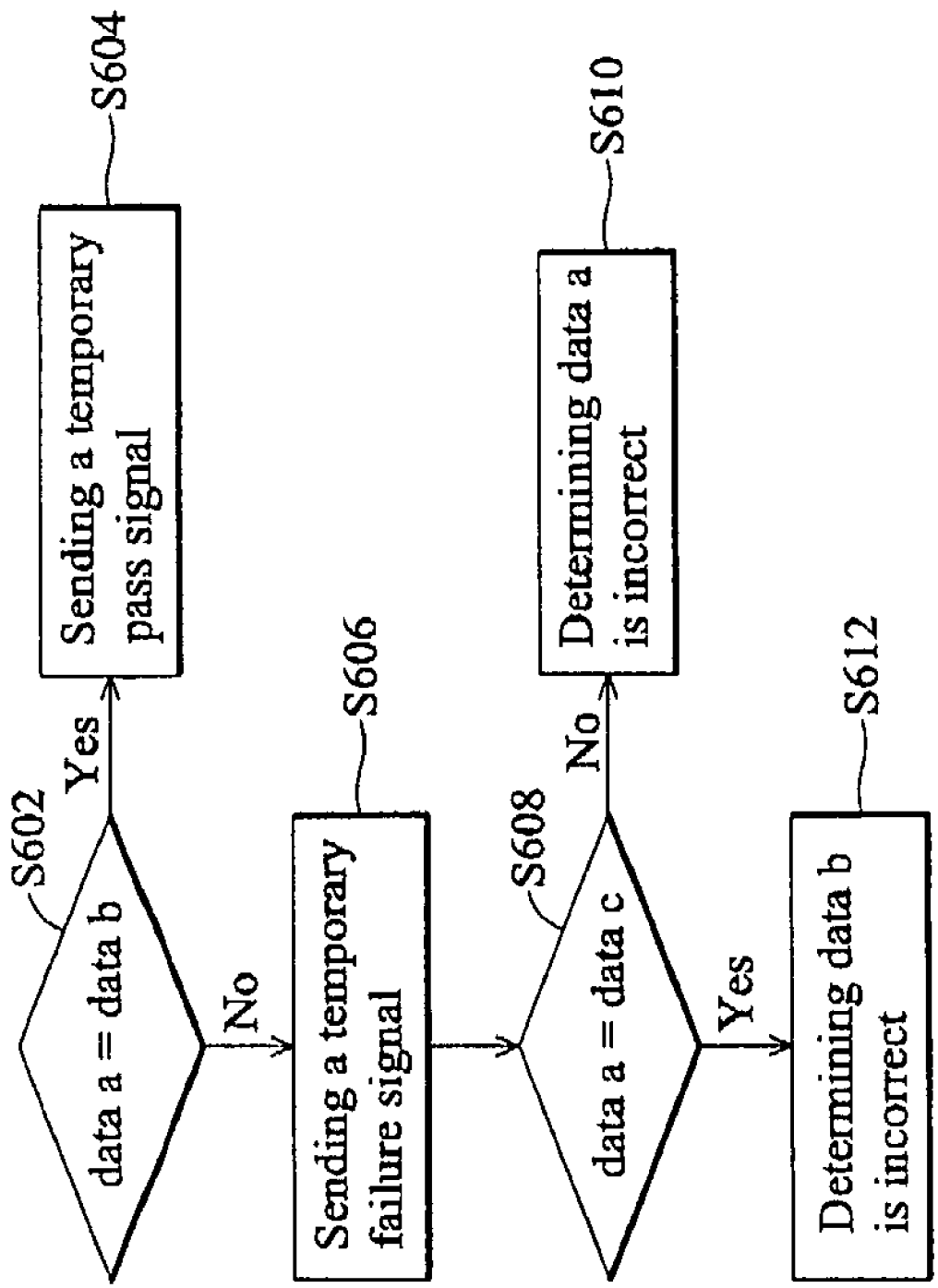
FIG. 6 is a flowchart for indicating the output with an erroneous data of a memory device under test in FIG. 5.

FIG. 6 is a flowchart of comparator $212_1$ in FIG. 2 indicating which output port is sending the erroneous data, equivalent to indicating the address of the defective memory cell. Similar flowcharts are suitable for other comparators $212_n$ and are not described in detail.

The data from the output ports A, B and C is assumed to be a, b and c, respectively. Data a and b are compared first at step S620. A temporary pass signal is sent if data a and b are identical (S604). A temporary failure signal is sent if data a and b are different (S606). In order to determine which one of data a and b is incorrect when data a and b are different, data c is taken to be used as reference. If data a and c are identical (as yes at S608), data b is determined to be incorrect (S612). If data a and c are different (as no at S608), which means data b and c are identical, data a is determined to be incorrect (S610). Briefly, the determination is a majority verdict, in which the major data are correct, and the minor data are incorrect. Thus, comparator $212_1$ outputs a corresponding signal to counter 220, and counter 220 generates an error indication signal similar to that in FIG. 3 to notify a outside test device the address of the defective memory cell.

Accordingly, the disclosed memory apparatus promptly finds the faulty cell addresses fast by the disclosed RPC device during the pre-fuse stage such that repair can be performed during the fuse stage. Compared to the conventional memory apparatus, the disclosed memory apparatus may reduce pin count required for testing apparatuses. On the other hand, one touch down of a probe card which has the same number of pin count may detect more memory devices. Thus, the average time for testing memory devices is decreased.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A reduced-pin-count device, comprising:
    an output verifier used to receive a plurality of outputs of a memory device under test and to compare the outputs with each other to determine whether the outputs of the memory device under test are identical, without an additional input pin, sending a pass signal if the outputs of the memory device under test are identical and sending a failure signal if at least one of the outputs of the memory device under test is different; and
    a counter used to output an error indication signal to indicate an output address of an erroneous data in the memory device under test if the output verifier sends the failure signal.

2. The reduced-pin-count device as claimed in claim 1, wherein a timing chart of the error indication signal is a failed cell position timing chart.

3. The reduced-pin-count device as claimed in claim 1, wherein the output verifier comprises:
    a plurality of comparators, wherein each comparator is used to receive a plurality of portions of the outputs of the memory device under test, to compare whether the portions of the outputs of the memory device under test are identical, sending a temporary pass signal if the portions of the outputs of the memory device under test are identical and sending a temporary failure signal if at least one portion of the portions of the outputs of the memory device under test is different; and
    an output combiner used to combine the temporary pass signal and the temporary failure signal sent by the comparators to determine whether all the comparators output the temporary pass signal.

4. The reduced-pin-count device as claimed in claim 3, wherein the comparators comprise at least a logic gate.

5. The reduced-pin-count device as claimed in claim 3, wherein the output combiner comprises at least a logic gate.

6. A reduced-pin-count method, comprising:
    verifying whether a plurality of outputs of a memory device under test are identical by comparing the outputs with each other, without an additional input pin, and sending a pass signal if the outputs of the memory device under test are identical and sending a failure signal if at least one of the outputs of the memory device under test is different; and
    sending an error indication signal to indicate an output address of an erroneous data in the memory device under test if the failure signal is sent.

7. The reduced-pin-count method as claimed in claim 6, further comprising:
    finding a faulty cell address in the memory device under test by a reduced-pin-count (RPC) device;
    replacing a defective memory cell indicated by the faulty cell address with a redundant memory cell; and
    verifying whether at least one error exists in the memory device under test.

8. The reduced-pin-count method as claimed in claim 7, wherein verifying whether at least one error exists in the memory device under test further comprises verifying whether at least one error exists by the RPC device or a built-in self test (BIST) device.

9. The reduced-pin-count method as claimed in claim 7, wherein the RPC device comprises:
    an output verifier used to receive a plurality of outputs of the memory device under test and to compare whether the outputs of the memory device under test are identical, sending a pass signal if the outputs of the memory device under test are identical and sending a failure signal if at least one of the outputs of the memory device under test is different; and
    a counter used to output an error indication signal to indicate the faulty cell address of the erroneous data in the memory device under test if the output verifier sends the failure signal.

* * * * *